United States Patent
Kao et al.

(10) Patent No.: US 7,933,732 B2
(45) Date of Patent: Apr. 26, 2011

(54) ELECTRONIC LOAD DEVICE FOR POWER SUPPLY PRODUCT TO BE TESTED AND METHOD FOR REGULATING BANDWIDTH THEREOF

(75) Inventors: Hung-Hsiang Kao, Taoyuan Hsien (TW); Wen-Chung Chen, Taoyuan Hsien (TW); Kuo-Cheng Liu, Taoyuan Hsien (TW); Ming-Ying Tsou, Taoyuan Hsien (TW)

(73) Assignee: Chroma Ate Inc., Taoyuan Hsien (TW)

( * ) Notice: Subject to any disclaimer, the term of this patent is extended or adjusted under 35 U.S.C. 154(b) by 279 days.

(21) Appl. No.: 12/355,303

(22) Filed: Jan. 16, 2009

(65) Prior Publication Data
US 2009/0187367 A1    Jul. 23, 2009

(30) Foreign Application Priority Data
Jan. 18, 2008   (TW) ............................. 97102096 A

(51) Int. Cl.
*G06F 19/00* (2011.01)
(52) U.S. Cl. ...................................... 702/108
(58) Field of Classification Search ............ 702/108
See application file for complete search history.

(56) References Cited

U.S. PATENT DOCUMENTS

| | | | | |
|---|---|---|---|---|
| 3,624,489 A * | 11/1971 | Betton | ........................... | 323/226 |
| 4,037,156 A * | 7/1977 | Goujon et al. | ............ | 324/764.01 |
| 4,357,574 A * | 11/1982 | Takamisawa et al. | ........ | 324/72.5 |
| 5,910,875 A * | 6/1999 | Tian et al. | ........................ | 361/78 |
| 7,466,162 B2 * | 12/2008 | Wong et al. | ............... | 324/764.01 |
| 2004/0201393 A1 * | 10/2004 | Nitadori | ......................... | 324/763 |
| 2009/0174413 A1 * | 7/2009 | Bucella et al. | ................. | 324/511 |
| 2010/0007370 A1 * | 1/2010 | Dishman et al. | ............... | 324/771 |

* cited by examiner

*Primary Examiner* — Cindy H Khuu
(74) *Attorney, Agent, or Firm* — Birch, Stewart, Kolasch & Birch, LLP

(57) ABSTRACT

An electronic load device provided for testing an OT (power supply to be tested) and the working bandwidth is regulated and set according to the output impedance of the OT. The electronic load device comprises a CPU, an impedance-bandwidth table, a voltage-current measurement unit, a power stage and a control module. Firstly, a current pulled out from the OT to the power stage is called by the CPU. Thereafter, an output impedance of the OT is measured by the voltage-current measurement unit and analysis by the CPU. Next, a working bandwidth of the electronic load device is regulated and set by the control module according to the output impedance and the impedance-bandwidth table.

4 Claims, 1 Drawing Sheet

ELECTRONIC LOAD DEVICE FOR POWER SUPPLY PRODUCT TO BE TESTED AND METHOD FOR REGULATING BANDWIDTH THEREOF

BACKGROUND OF THE INVENTION

1. Field of the Invention

The present invention relates to an electronic load device, and more particularly to an electronic load device is capable of regulating a working bandwidth regulated for a power supply product to be tested.

2. Description of the Prior Art

In the power supply industry, when developing a power source such as power supply or UPS uninterrupted power source product (hereinafter called objected to be tested and abbreviated as OT), an electronic loading is usually provided for tests. It is due to the fact that the real load constructed by the resistors, inductors and capacitors are usually not easy to be changed due to some reasons such as the component adjustment are rather poor and difficulty to be carried out but unfortunately it is usually a necessary process.

However, the electronic loading device is not like the real load constructed by the purely passive components such as resistor(s), inductor(s) and capacitor(s). The passive components are found have the characteristic of response soon and bandwidth thereof infinite. It is thus the load varies with the input voltage and will be responded on the pulled out current so that the testing system is very stable while using the real load.

By contrast, the electronic loading device is just providing a simulated load. Hence, the response time is incompatible with the real load. Aside from that, the output impendence of the OT may affect the working bandwidth range. That is to say that the operation conditions of the electronic loading device usually closely related to the output of OT. Since the electronic loading device according to prior art are usually found to have a finite but a fixed bandwidth range that is the main reason why a testing engineer who is not familiar to the output of OT but performs a test with high current may cause the testing system encountered malfunctions, or even causes the OT or the electronic loading device to be burned down due to abnormal oscillation.

Consequently, the applied field of the electronic load device is highly restricted.

An object of the present invention is to solve above problems. The working bandwidth of the electronic loading device according to the present invention is adjustable.

SUMMARY OF THE INVENTION

An electronic load device provided for testing an OT (power supply to be tested) and the working bandwidth is regulated and set according to the output impedance of the OT. The electronic load device comprises a CPU, an impedance-bandwidth table, a voltage-current measurement unit, a power stage and a control module. Firstly, a current pulled out from the OT to the power stage is called by the CPU. Thereafter, an output impedance of the OT is measured by the voltage-current measurement unit and analysis by the CPU. Next, a working bandwidth of the electronic load device is regulated and set by the control module according to the output impedance of the OT and the impedance-bandwidth table.

BRIEF DESCRIPTION OF THE DRAWINGS

The present invention will be more fully understood from the detailed description, which will be given hereinafter, with the aid of the illustrations as below.

DESCRIPTION OF THE PREFERRED EMBODIMENT

Figure 1:
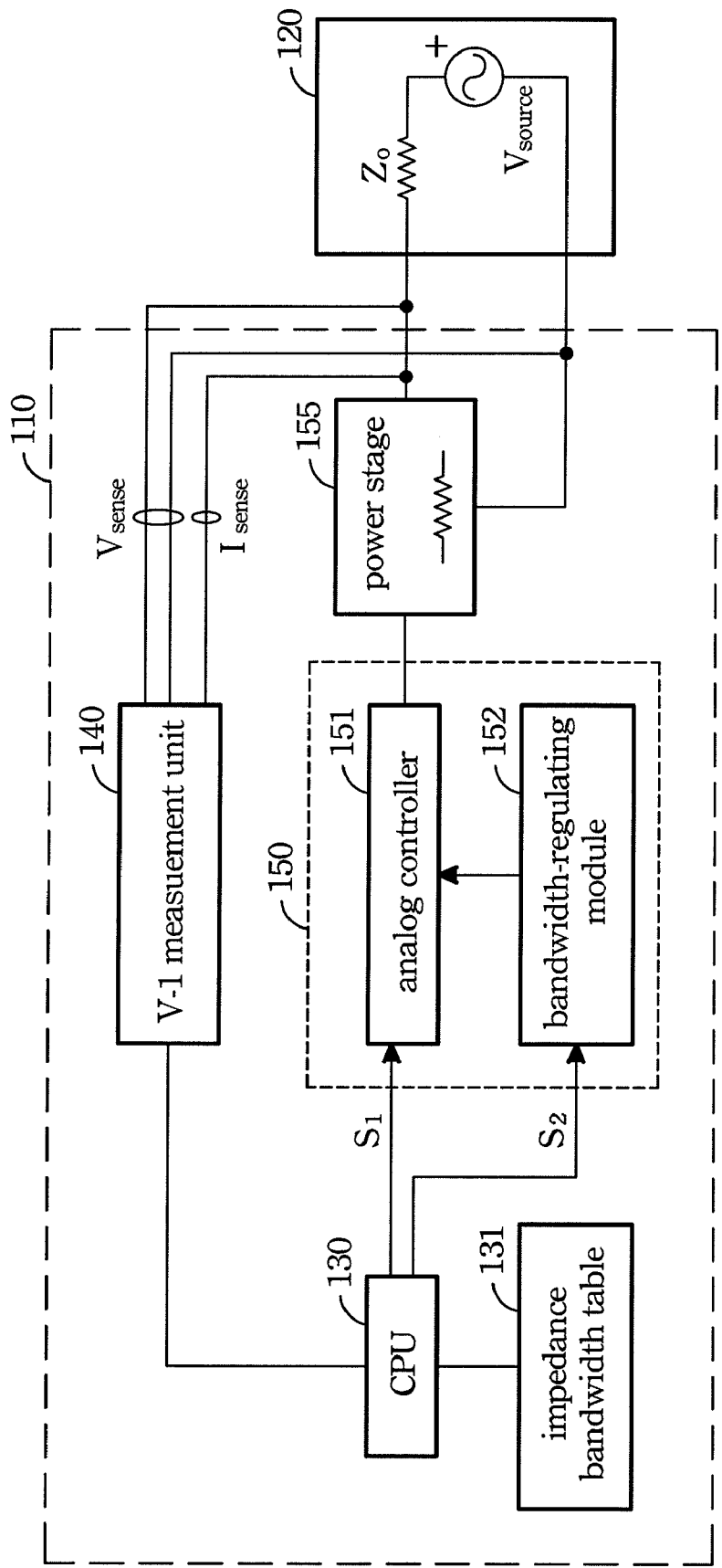
FIG. 1 shows the function blocks of an electronic load device and a OT in accordance with the present invention.

As forgoing description in the background of the invention, the AC power supply products in the current market have a variety of output characteristics and can not be summarized as an universal type. As the knowledge of the author, the main stream of impedance of the power supply is inductance type. The distribution range of the inductance of the power supply is found from a several of $\mu H$ to $mH$ (Henry). Therefore, to perform an active operation in such border range to test an OT by using the electronic load, it should have an electronic loading device whose bandwidth is adjustable according to output impedance inherited.

The present invention is to develop such an electronic loading device. Accordingly, a mapping table having relationships between the bandwidth versus output impedance is built up firstly. The mapping table hereinafter called impedance-bandwidth table. That is the output impedance of OT will be measured before it is to be tested. And then the bandwidth of the electronic load device is adjusted according the impedance-bandwidth table. With the electronic load device having bandwidth adjustable or say regulating, the disaster due to unmatched of the impedance and the bandwidth will not be raised.

Referring to FIG. 1, the schematic view shows that the function blocks of a novel electronic load device 110 and the OT 120. The novel electronic load device 110 having operated bandwidth adjustable based on the output impedance of the OT 120 according to a preferred embodiment of the present invention. The electronic load device 110 includes: a CPU 130, an impedance-bandwidth table 131, a voltage-current measurement unit 140, a control module 150 having an analog controller 151, and a bandwidth regulating module 152, a power stage 155. The power stage is an active load contains one or more power transistor(s) or something like to consume a large current so that it serves as a simulated load. The impedance-bandwidth table 131 may be stored in a ROM (read only memory) or EEPROM (electronic erasable program ROM). The OT 120 has an outputting impedance and an alternative voltage source to be tested.

As forgoing description, the impedance-bandwidth table 131 stored with mapping data between the output impedance and bandwidths. To regulating the bandwidth of the electronic load device so that the bandwidth of the electronic load device can match with the OT 120, a first signal s1 is sent from the CPU 130 to the analog controller 151. The analog controller 151 will pull out a current from the OT 120 to the power stage 155 which is a simulated load for OT 120. While the OT 120 is outputting the current to the power stage 155, the voltage-current measurement unit 140 will sense the voltage between two output terminals of the OT 120 and the output current of the OT so that the impedance of the OT 120 can be calculated accordingly.

Thereafter, the CPU fetches the output impedance signal from the voltage-current measurement unit 140 and then compares it with the data stored in the impedance-bandwidth table 131. The CPU then outputs a second signal s2 to the bandwidth regulating module 152 so that an appropriated working bandwidth range of the electronic device is regulated for the present OT 120. Thereafter, the electronic load device 110 can start a series of normal testing processes to the OT 120.

Worthwhile the alternative voltage source type OT is just for illustrating conveniently only. The OT can also be a direct voltage source type.

The benefit of the present invention are:

(1) the working bandwidth of the electronic load device can be regulated automatically according to the OT so that the working bandwidth of the electronic load device can match with the OT. It is the burn-down risk of the OT and the electronic load device can be avoided.

(2) the output impedance of the OT can be automatically measured.

(3) the cost increase of the electronic load device is small since the CPU, impedance-bandwidth table and bandwidth regulating module are extra blocks in comparison with the conventional electronic load device.

As is understood by a person skilled in the art, the foregoing preferred embodiment of the present invention is an illustration, rather than a limiting description, of the present invention. It is intended to cover various modifications and similar arrangements included within the spirit and scope of the appended claims, the scope of which should be accorded the broadest interpretation so as to encompass all such modifications and similar structures.

We claim:

1. An electronic load device, provided for testing an OT (power source product to be tested), comprising:
   a central process unit (CPU);
   a voltage-current measurement unit, to measure an output impedance of the OT and output the output impedance signal to said CPU;
   a power stage connected with the OT so that said power stage is simulated as a load for the OT;
   a control module receiving a first signal and a second signal from said CPU so as to control said power stage, wherein said first signal is a current pulled out command, and said second signal is a bandwidth range setting command;
   an impedance-bandwidth table connected with said CPU;
   so that said electronic load device can regulating an bandwidth range according to the output impedance of the OT, after the output impedance of the OT is measured.

2. The electronic load device according to claim 1 wherein said control module; comprise an analog controller, a bandwidth regulating module, and said bandwidth regulating module receives said second signal and accordingly, provides said bandwidth range to said analog controller.

3. The electronic load device according to claim 1 wherein said second signal depends on said impedance-bandwidth table and the output impedance of the OT.

4. A method for testing an OT (power source product to be tested) by using a electronic load device, said electronic load device having an impedance-bandwidth table so that a working bandwidth range will be regulated and set according to an output impedance of the OT, comprising the steps of:
   sending a first signal to a control module from a CPU so as to pull out an outputting current from the OT to a power stage;
   measuring the outputting current and a terminal voltage of the OT;
   calculating the output impedance of the OT,
   outputting a second signal to said control module according to the output impedance and said impedance-bandwidth table;
   regulating and setting the working bandwidth range of the electronic load device according to said second signal by said control module.

* * * * *